(12) United States Patent
Hu

(10) Patent No.: US 9,502,547 B2
(45) Date of Patent: Nov. 22, 2016

(54) CHARGE RESERVOIR IGBT TOP STRUCTURE

(71) Applicant: Alpha and Omega Semiconductor Incorporated, Sunnyvale, CA (US)

(72) Inventor: Jun Hu, San Bruno, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/832,517

(22) Filed: Aug. 21, 2015

(65) Prior Publication Data

US 2015/0357450 A1 Dec. 10, 2015

Related U.S. Application Data

(62) Division of application No. 14/082,582, filed on Nov. 18, 2013, now Pat. No. 9,123,770.

(51) Int. Cl.
| | |
|---|---|
| H01L 29/739 | (2006.01) |
| H01L 29/66 | (2006.01) |
| H01L 29/10 | (2006.01) |
| H01L 29/423 | (2006.01) |
| H01L 29/08 | (2006.01) |
| H01L 29/06 | (2006.01) |

(52) U.S. Cl.
CPC ....... *H01L 29/7397* (2013.01); *H01L 29/0696* (2013.01); *H01L 29/086* (2013.01); *H01L 29/1095* (2013.01); *H01L 29/4236* (2013.01); *H01L 29/66348* (2013.01)

(58) Field of Classification Search
CPC ............. H01L 29/7397; H01L 29/1095; H01L 29/66348; H01L 29/0696; H01L 29/4236; H01L 29/086
USPC .......................................... 438/138; 257/139
See application file for complete search history.

(56) References Cited

U.S. PATENT DOCUMENTS

| | | | |
|---|---|---|---|
| 6,724,043 B1 | 4/2004 | Ekkanath Madathil | |
| 8,441,046 B2 | 5/2013 | Bobde et al. | |
| 8,785,279 B2 | 7/2014 | Bhalla et al. | |
| 9,123,770 B2 | 9/2015 | Hu | |
| 2007/0080379 A1 | 4/2007 | Peake | |
| 2007/0138544 A1 | 6/2007 | Hirler et al. | |
| 2007/0267663 A1* | 11/2007 | Harada | ............... H01L 29/0834 257/288 |

(Continued)

*Primary Examiner* — Walter H Swanson
(74) *Attorney, Agent, or Firm* — Joshua D. Isenberg; JDI Patent

(57) ABSTRACT

An IGBT device may be formed from a substrate including a bottom semiconductor layer of a first conductivity and an upper semiconductor layer of a second conductivity type located above the bottom semiconductor layer. Trenches for trench gates are formed in the substrate. Each trench extends vertically into the upper semiconductor layer and is provided with a gate insulator on each side of the trench and is filled with polysilicon. A first conductivity type floating body region is formed between two neighboring trenches and over the substrate. A bottom of the floating body region is close in depth to but above a bottom of the polysilicon in the trench. A heavily doped second conductivity type top region is formed over the floating body region. A first conductivity type body region is formed over the top region. The floating body region has a lower doping concentration than the body region.

12 Claims, 9 Drawing Sheets

(56) References Cited

U.S. PATENT DOCUMENTS

| | | |
|---|---|---|
| 2007/0272978 A1 | 11/2007 | Mauder et al. |
| 2009/0173993 A1 | 7/2009 | Andrews et al. |
| 2010/0039844 A1* | 2/2010 | Arai .................. H01L 29/0839 363/131 |
| 2012/0104555 A1* | 5/2012 | Bobde ................ H01L 29/0696 257/587 |
| 2012/0319163 A1* | 12/2012 | Tsuzuki ................ H01L 21/263 257/140 |
| 2013/0001694 A1 | 1/2013 | Guan et al. |
| 2013/0049102 A1 | 2/2013 | Bobde et al. |
| 2013/0134478 A1 | 5/2013 | Nakajima et al. |
| 2013/0256745 A1* | 10/2013 | Tang .................. H01L 29/7397 257/139 |
| 2015/0035003 A1 | 2/2015 | Hu |

* cited by examiner

CHARGE RESERVOIR IGBT TOP STRUCTURE

CLAIM OF PRIORITY

This application is a division of commonly-assigned, co-pending application Ser. No. 14/082,582, filed Nov. 18, 2013, the entire disclosures of which are incorporated herein by reference.

FIELD OF THE INVENTION

This invention generally relates to semiconductor power devices. More particularly, this invention relates to device structures for insulated gate bipolar transistors (IGBT) and methods for manufacturing thereof.

BACKGROUND OF THE INVENTION

An insulated gate bipolar transistor (IGBT) is a semiconductor power device with a compositing structure that combines features of a metal-oxide-semiconductor field effect transistor (MOSFET) and a bipolar junction transistor (BJT). Performance-enhancing features of an IGBT are designed to achieve a higher current density than a MOSFET, and faster and more efficient switching characteristics and better control than a BJT. Additionally, the drift region of the IGBT can be lightly doped for improved blocking ability. Meanwhile, an IGBT device can still have good conductivity because the lightly doped drift region undergoes high level carrier injection from a bottom P collector region resulting in conductivity modulation. With the MOSFET's characteristic of easy control with a gate electrode, the bipolar current flow mechanism and the advantages of shorter switching time and lower power loss, the IGBT is widely applied in a high voltage and high power application.

Conventional technologies to configure and manufacture IGBT devices are still confronted with difficulties and limitations to further improvement in performance due to various tradeoffs. In IGBT devices, there is a tradeoff between conduction loss and turn-off switching losses, $E_{off}$. Conduction loss depends upon the collector to emitter saturation voltage $V_{ce(SAT)}$ at rated current. Greater carrier injection while the device is on improves the conductivity of the device, thus reducing conduction loss. Increased carrier injection would, however, cause higher turn-off switching losses because of energy dissipated in clearing out injected carriers during turn-off.

Another trade-off exists between the IGBT's collector-emitter voltage at saturation ($V_{ce(SAT)}$) and its breakdown voltage ($V_{BD}$). While an increase on topside injection may improve $V_{ce(SAT)}$, it usually comes at a cost of lowering breakdown voltage $V_{BD}$. An IGBT device with a high density of deep trenches may overcome this trade-off, but it is hard to make such device with a high density of small pitch high aspect ratio trenches.

Various configurations of IGBT devices have been developed in recent years. FIG. 1A is a cross sectional view of a conventional IGBT device 100A. In the example shown in FIG. 1A, a heavily doped N layer 102A is disposed below the channel region 103A and at the top of the lightly doped drift region 101A to further enhance the carrier injection on the topside. However, such a device has a lower breakdown voltage and has a high $C_{rss}$ capacitance due to the heavily doped N layer 102A. The high $C_{rss}$ capacitance of the IGBT device may slow down the device switching speed and lead to higher switching energy loss.

FIG. 1B is a cross sectional view of a conventional IGBT device 100B having a planar gate 136 with a trench shield electrode configuration. The IGBT device 100B is formed in semiconductor substrate 105 that has a first conductivity type, e.g., a P type substrate 105. An epitaxial layer 110 of a second conductivity type, e.g., an N-epitaxial (epi) layer 110, is supported on top of the P-type substrate, 105. A collector electrode 120 disposed on a bottom surface of the substrate. In this type of device, shield trenches 135-S have a shield electrode 137 surrounded by dielectric (e.g. oxide) 126. The shield trenches 135-S in the device 100B do not have a gate electrode component. Instead, a planar gate 136 is disposed on planar gate oxide 125-P that insulates the planar gate 136 from the semiconductor surface. A shield electrode 137 is connected to the source/emitter voltage. In this example, the channel is generally horizontal, running at the top of the body region 140, beneath the planar gate 136, from the source 130 (and optional lightly doped source 131) to the top of a heavily doped N+ region 145. This embodiment may be easier to manufacture, as it is simple to form a planar gate and because the shield trench 135-S with its single electrode is much easier to form than a shield gate trench structure with multiple electrodes. The shield trench 135-S still charge compensates the N+ region 145 to keep the breakdown voltage (BV) high, and also keeps the capacitance Crss low for fast and efficient switching. While device of the type shown in FIG. 1B may achieve a reduced $C_{rss}$ and increased injection with lower $E_{on}$ and $E_{off}$ losses, it requires high density deep trenches. In addition, the heavily-doped N region 145 may degrade the breakdown voltage.

FIG. 1C is a cross-sectional view of another IGBT with partially narrow mesa in the $3^{rd}$ dimension. With the configuration of the narrow region between the gates such configuration, the injection enhancement can be increased. However, such a device requires complicated design and process. An example of such a design and process may be found in M. Sumitomo, J. Asai, H. Sakane, K. Arakawa, Y. Higuchi, and M. Matsui, "Low loss IGBT with Partially Narrow Mesa Structure (PNM-IGBT)," Proceeding of the 2012 international Symposium on Power Semiconductor Devices and ICs, page 17, 2012.

There exists a need to develop an IGBT configuration without having high-density deep trenches or complicated design/process so as to reduce cost and improve performance without sacrificing breakdown.

It is within this context that aspects of the present disclosure arise.

DESCRIPTION OF THE SPECIFIC EMBODIMENTS

Figure 1A:
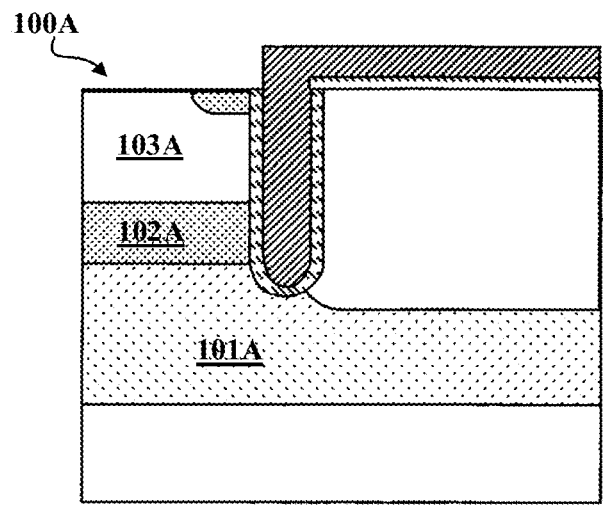
FIGS. 1A to 1C are cross sectional views showing three different configurations of conventional IGBT devices.
Figure 1B:
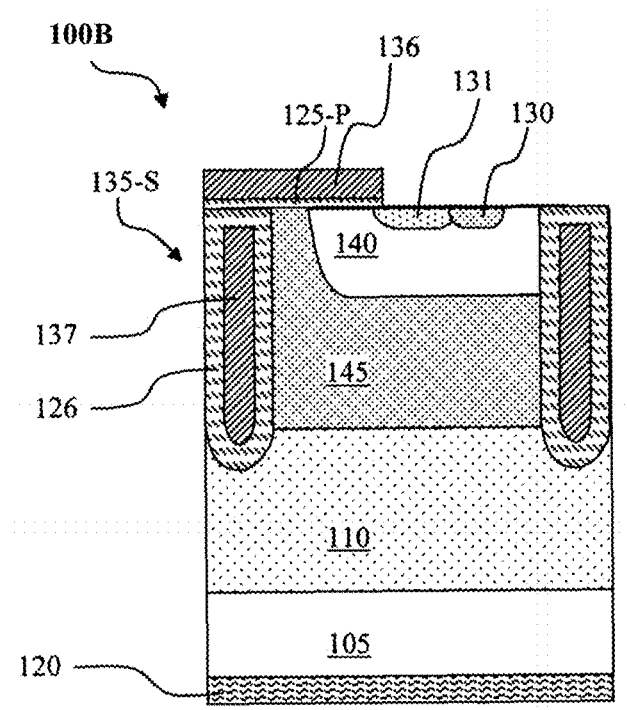
Figure 1C:
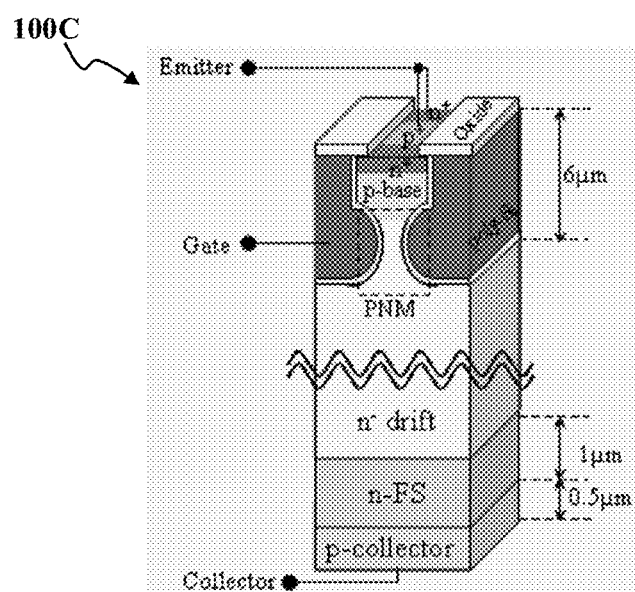

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following detailed description, reference is made to the accompanying drawings, which form a part hereof, and in which is shown by way of illustration specific embodiments in which the invention may be practiced. In this regard, directional terminology, such as "top," "bottom," "front," "back," "first," "second," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In the following discussion, the first conductivity type is typically P and the second conductivity type is N. However, it should be noted that substantially similar devices may be fabricated using a similar process but with conductivity types opposite those shown and described. Specifically, aspects of the present disclosure include implementations like those shown and described herein in which N is substituted for P and vice versa.

According to one aspect of the present disclosure, an insulating gate bipolar transistor (IGBT) device comprises a substrate including a bottom semiconductor layer of a first conductivity type and an upper semiconductor layer of a second conductivity type, one or more trench gates each formed in a corresponding trench disposed over the substrate, a floating body region of the first conductivity type disposed between two neighboring trench gates and over the substrate, a heavily doped top region of the second conductivity type disposed between the two neighboring trench gates and over the floating body region, and a body region of the first conductivity type disposed between the two neighboring trench gates and over the top region. The trench is provided with a gate insulator on each side of the trench and filled with polysilicon. A doping concentration of the floating body region of the first conductivity type is lower than that of the body region of the first conductivity type.

According to one aspect of the present disclosure, a method for forming an insulating gate bipolar transistor (IGBT) device comprises the steps of providing a substrate including a bottom semiconductor layer of a first conductivity and an upper semiconductor layer of a second conductivity located above the bottom semiconductor layer, forming one or more trenches for trench gates provided with a gate insulator on each side of the trenches and filled with polysilicon, forming a floating body region of the first conductivity type between two neighboring trenches and over the substrate, forming a heavily doped top region of the second conductivity type over the floating body region, and forming a body region of the first conductivity type over the top region. A doping concentration of the floating body region of the first conductivity type is lower than that of the body region of the first conductivity type.

Figure 2A:
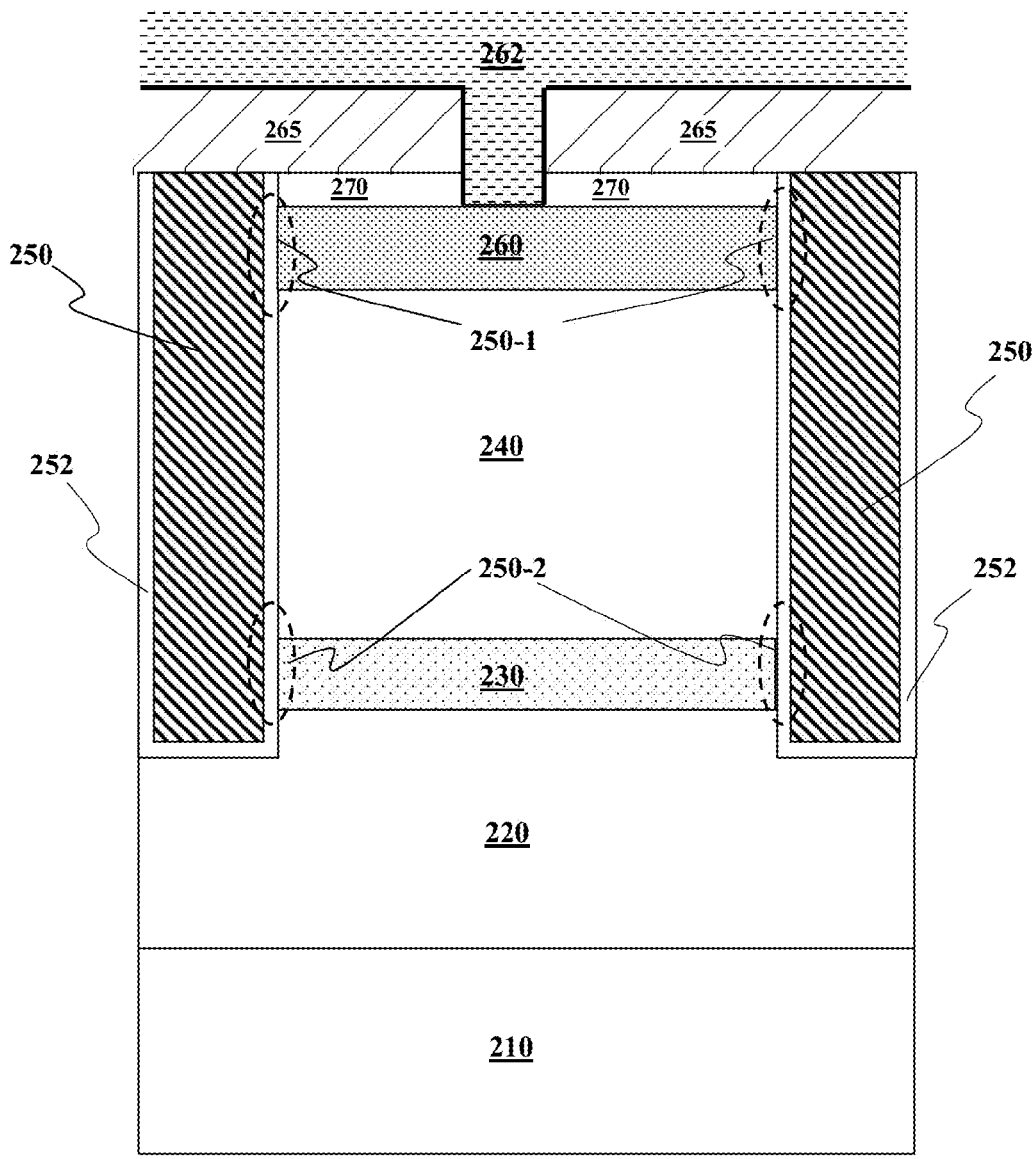
FIG. 2A is a cross-sectional view of an IGBT device according to an aspect of the present disclosure.

FIG. 2A is a cross-sectional view of an IGBT device having a charge reservoir configuration according to an aspect of the present disclosure. The IGBT device 200 is formed in semiconductor substrate 210 that has a first conductivity type, e.g., a P type substrate. An epitaxial layer 220 of a second conductivity type, e.g., an N-epitaxial layer, is provided on top of the P-type substrate 210. Alternatively, the P type substrate 210 and the epitaxial layer 220 may together be referred to as the semiconductor substrate since they both generally have a monocrystalline structure. In addition, the P-type substrate 210 may be more generally referred to as a bottom or lower semiconductor layer and functions as a collector region. The epitaxial layer 220 may be more generally referred to as an upper semiconductor layer and functions as a drift region above the collector region 210. The doping concentration of the drift region 220 may be in a range between 1e13 cm$^{-3}$ to 1e15 cm$^{-3}$ depending on the desired breakdown voltage. Lower doping concentration of the draft region 220 may lead to higher breakdown voltage. In one embodiment, the IGBT device 200 is a vertical IGBT device with a collector electrode (not shown) disposed on a bottom surface of the substrate and an emitter electrode 262 disposed on a top surface of the substrate.

The IGBT device 200 of FIG. 2 includes a plurality of trench gates 250 extending vertically in the drift region 220. The plurality of the trench gates 250 each is formed in a corresponding trench structure. The trench structure is provided with a gate insulator (e.g., gate oxide 252) on each side of the trenches and all completely filled with polysilicon. Specifically, the trench extends vertically to a depth approximately in a range from about 5 to about 10 microns. The pitch of the gate trenches may be in a range from about 3 to about 15 microns, preferably from 5 to 10 microns, and more preferably from 6 to 8 microns. By way of example, the ratio of pitch to trench depth may be between about 0.5 to about 3. The trench width may range from about 1 to about 3 microns. For the IGBT device of the present disclosure, the gate oxide 252 around the trench for the gate 250 may be in a thickness ranging from about 400 to about 1500 angstroms.

The IGBT device 200 of FIG. 2 further includes a floating body region of the first conductivity type (e.g., floating P body) 230 provided over the drift region 220 and between every two trench gate 250. The thickness of the floating P body 230 may be about 1 micron or more. The bottom of the floating P body 230 is preferably provided close to the bottom of the gate 250 but is provided above the bottom of the trench gate 250. By way of example, the difference in depth between the bottom of the floating P body 230 and the bottom of the gate 250 may be about 1 micron or less. The doping concentration of the floating P body 230 may be in the range from 1e16 cm$^{-3}$ to 5e17 cm$^{-3}$ and is lower than the doping concentration of the P body region 260 (described below). The IGBT device 200 further includes a top layer of the second conductivity type (e.g., N+ floating body) 240 provided over the floating P body 230 and between the trench gates 250. The doping concentration of the N floating body 240 ranges from about 5e16 cm$^{-3}$ to about 5e17 cm$^{-3}$. Since the N floating body 240 is completely isolated by the floating P body 230 and the trench gates on either side of it, it acts like a charge reservoir. The topside injection efficiency can be enhanced with the highly doped N+ floating body 240.

Above the N floating body 240, a body region of a first conductivity type (e.g., P body) 260 is provided between every two gate structure 250 as an emitter region. The depth of the P body 260 at top is preferably about 10% to 40% of the trench depth. The doping concentration of the P body 260 is higher than that of the floating P body 230. By way of example, the doping concentration of the P body 260 may range from 1e17 cm$^{-3}$ to 1e18 cm$^{-3}$. The IGBT device of FIG. 2A further includes a source region 270 of a second conductivity type (e.g., an N-type source region) is provided over the P body 260 near the top surface of the semiconductor substrate. The source region 270 is heavily doped with a doping concentration above about 1e20 cm$^{-3}$. An emitter electrode 262 disposed on an insulating layer 265 on the top surface of the semiconductor substrate is electrically connected to the source region 270 and the P-body/emitter region 260. The trench gate 250 of the IGBT device has two gate segments: 250-1 and 250-2. The gate segment 250-1 is formed between the trench gate poly 250 and the P body 260 and the other gate segment 250-2 is formed between the trench gate poly 250 and the floating P body 230. The doping concentrations of the P body 260 and the P floating body 230 should be carefully designed to make sure that the threshold voltage (Vth) of gate segment 250-1 is higher than 250-2. Therefore, the segment 250-1 controls when the device turns on and off.

Figure 2B:
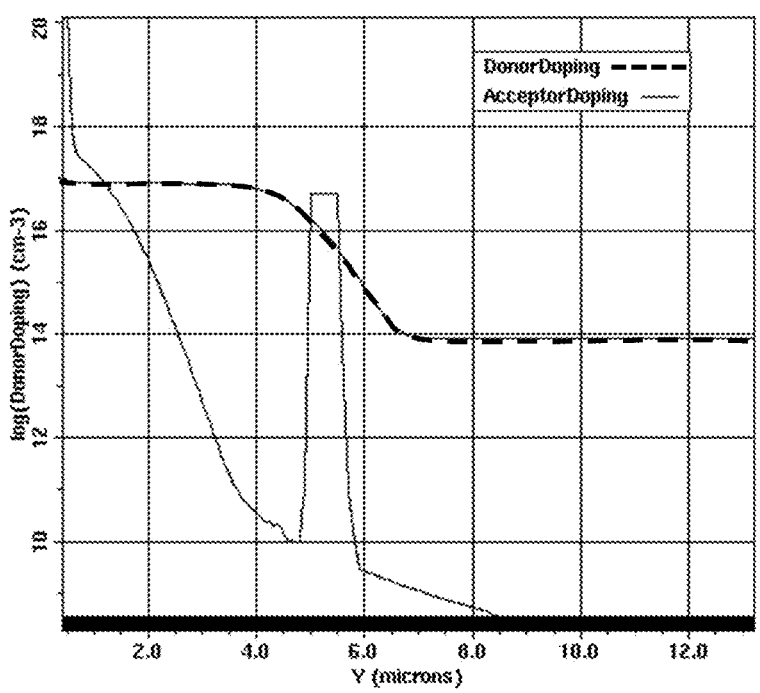
FIG. 2B is a graph showing the doping profile of an IGBT device according to an aspect of the present disclosure.

FIG. 2B is a graph showing an example of a doping profile of an IGBT device configured according to an aspect of the present disclosure. The X axis represents doping concentration and the Y axis represents depth of the semiconductor substrate. For example, in the depth of about 5 to 6 microns, the solid line has a spike in doping concentration corresponding to the floating P body 230.

Figure 3A:
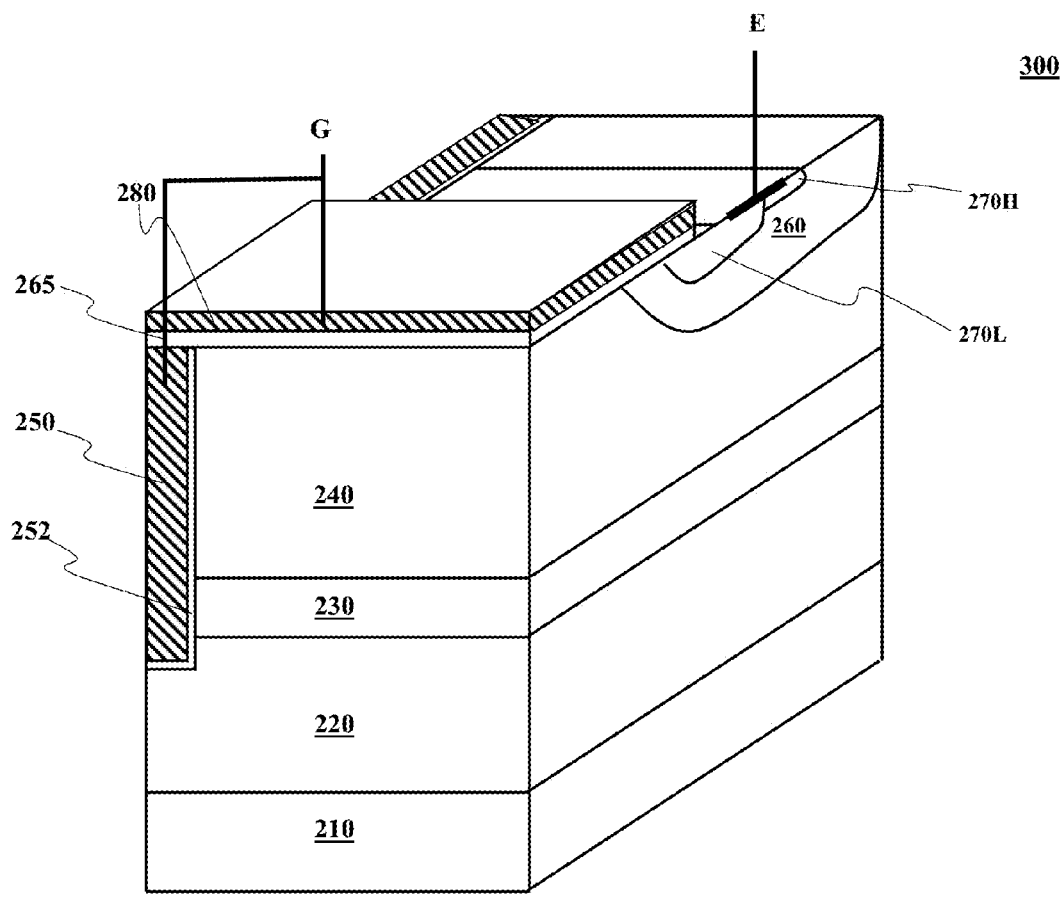
FIG. 3A is a cross sectional view of the IGBT device according to an aspect of the present disclosure in the $3^{rd}$ dimension.
Figure 3B:
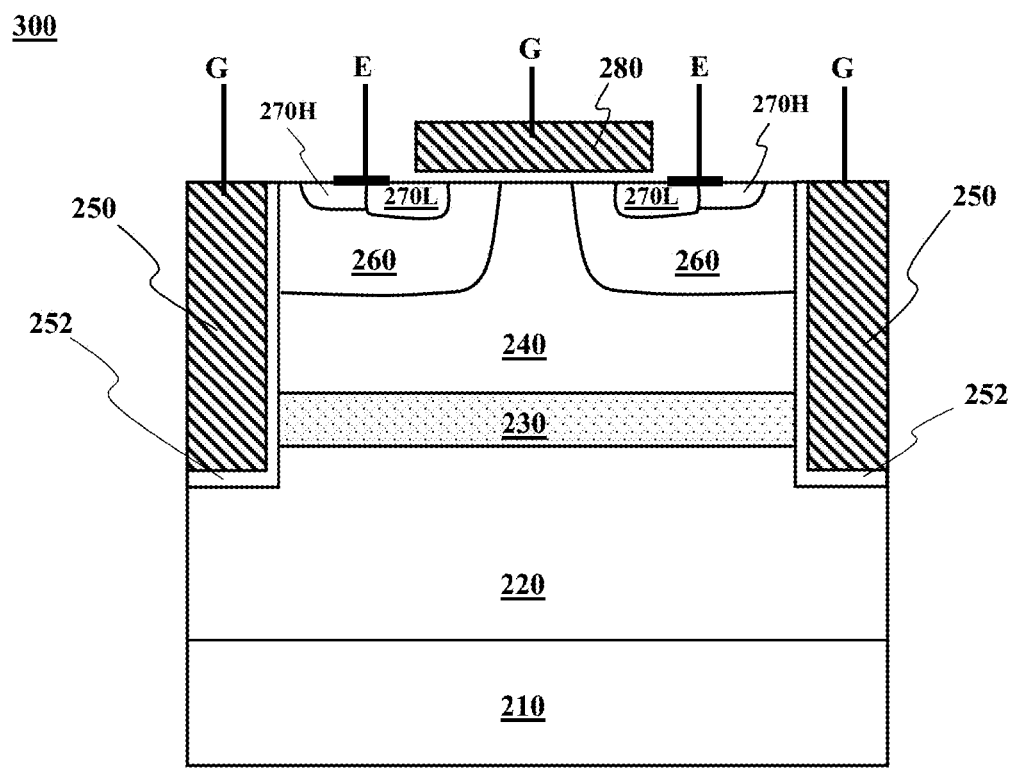
FIG. 3B is a cross-sectional view of FIG. 3A.

FIG. 3A is a cross sectional view of the IGBT device 300 in the 3$^{rd}$ dimension showing the planar gate 280 provided over the semiconductor substrate. The gate electrode of the IGBT device is formed by connecting the planar gate 280 and the trench gate 250 electrically. The planar gate 280 should have a higher Vth than the trench gate 250 and controls when the device turns on and off. Moreover, the IGBT device 300 further adds a lightly doped N-type source region 270L located between the highly doped N-type source region 270H and the beginning of the planar gate 280. The lightly doped source region 270L provides additional series resistance which adds a voltage drop during current flow, leading to emitter de-biasing. This voltage drop is small and negligible at normal operating currents. During high currents, such as those produced during a short circuit, the voltage drop is high, which significantly reduces the saturation current density ($J_{sat}$) and improves the device's ability to withstand a short circuit. This also allows for a smaller cell pitch design while keeping the saturation current density $J_{sat}$ low. FIG. 3B is a cross section view of the IGBT device 300 in two dimensions.

Figure 4:
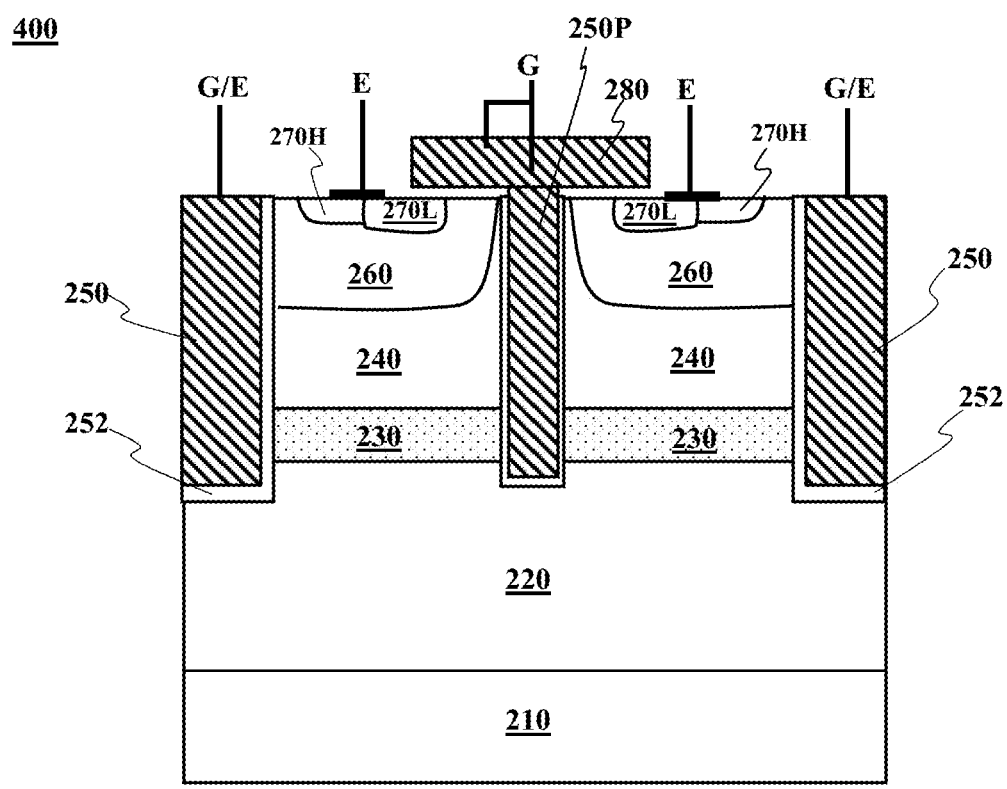
FIG. 4 is a cross-sectional view of an IGBT device according to an aspect of the present disclosure.

FIG. 4 is a cross sectional view of the IGBT device 400 according to an aspect of the present disclosure. The IGBT device 400 is similar to the IGBT device 300 of FIG. 3B and further includes a trench gate 250P provided under the planar gate 280 and between the emitter regions 260 (i.e., the P body). The trench gate 250P extends on its top side to connect to the planar gate 280 as shown in FIG. 4. The trench poly 250 in this case can be connected to gate electrode or emitter electrode so that the Crss of the device is tunable to meeting different switch speed requirements.

The IGBT device of the present disclosure provides several advantages over conventional IGBT devices. For a conventional trench IGBT device without the floating P body 230, there is a fundamental trade-off between the $V_{ce(SAT)}$ and the breakdown voltage because the breakdown voltage is very sensitive to the doping level of the N region under the P body/emitter region. A low $V_{ce(SAT)}$ can be achieved by increasing the doping of the N region under the P body and increasing the injection efficiency from the topside. However, a higher doping level of the N region under the P body will lower the breakdown voltage of the device. For the IGBT device of the present disclosure, the floating P body 230 isolates the floating N body 240 above the floating P body and provides a charge balance and a good electrical field shield to the floating N body 240. Under the reverse bias, the side walls of the floating N body 240 between the gate segments 250-1 and 250-2 are depleted at a low reverse voltage and make the floating P body 230 and the P body 260 punching-through. So the voltage drop between the junction of the P body 260 and the floating N body 240 is self clamping at an electrical field lower than the critical field of the junction. The avalanche breakdown only happens at the junction between the floating P body 230 and the N drift layer 220. Therefore, the breakdown voltage of the IGBT is not sensitive to the doping concentration of the floating N body 240. For the same breakdown voltage rating, the doping level of the floating N body 240 under the P body 260 of the IGBT device of the present disclosure can be 5 to 10 times higher than doping of the N region under the P body of the conventional IGBT devices.

According to IGBT configurations of the present disclosure, the structure and the fabrication becomes simplified by having the floating P-body between the gate trenches. Since the floating P body 230 and trench structure provide a good shield of floating N body 240, there is no need for high density trenches, and thus the gate trench pitch can be wider. In addition, the fabrication process is simplified with only one trench formation, one gate oxidation and one polysilicon filling process.

Because of the much higher doping of the floating N body 240, the injection efficiency from the top side is enhanced and the carrier concentration under the P body is 5 to 10 times higher than the conventional IGBT devices at the on-state. In addition to that, the vertical channels formed on the side walls of the P body 260 under the gate bias short the floating N body 240 to the emitter potential through the vertical gate channel. In this case, a thyristor structure is formed by the P substrate 210, the N drift layer 220, the floating P body 230 and the floating N body 240. Both the thyristor structure and the high topside injection enhancement contribute to a significantly lower Vcesat than the conventional IGBT devices.

Though the IGBT device of the present disclosure show thyristor I-V curves at the on-state, the forward I-V characteristics of the device do not have a snapback like a thyristor. Conventionally, there is a snapback in the IV curve when a thyristor device turns on. That is, the voltage initially goes up and then snaps back. For IGBT devices of the type described in the present disclosure, the voltage of the IGBT device goes up without having a snapback when the device turns on. When the positive gate bias (normally 15V) is applied to switch on the IGBT, two inversion channels formed at the gate segment 250-2 short the floating N body 240 to the N drift layer 220. When the collector voltage start to increases from 0V, the current only goes through the inversion channel at the side wall of the floating P body 230 and the device is turning on like a conventional IGBT. With the increase of the total current, the voltage difference between the floating P body 230 and the floating N body 240 increases, more and more current gradually moves to the center of the floating P body 230 and the device behaves more like a thyristor.

Moreover, the IGBT device of this present disclosure show a good saturation current, which is important for the short circuit robustness of the devices. When the voltage of the collector increases, the electrical potential of the floating N body increases and form depletion layers on the side walls of the floating N body 240 when the potential of the floating N body 240 is higher than the gate bias on 250, which will make the floating p body 230 and P body 260 punching-through and provide a path for the hole current. The holes coming into the floating P body 230 will sweep into the P body 260 through this path, therefore the current going to the floating N body 240 is limited and the device is saturated like an conventional IGBT devices.

Figure 5A:
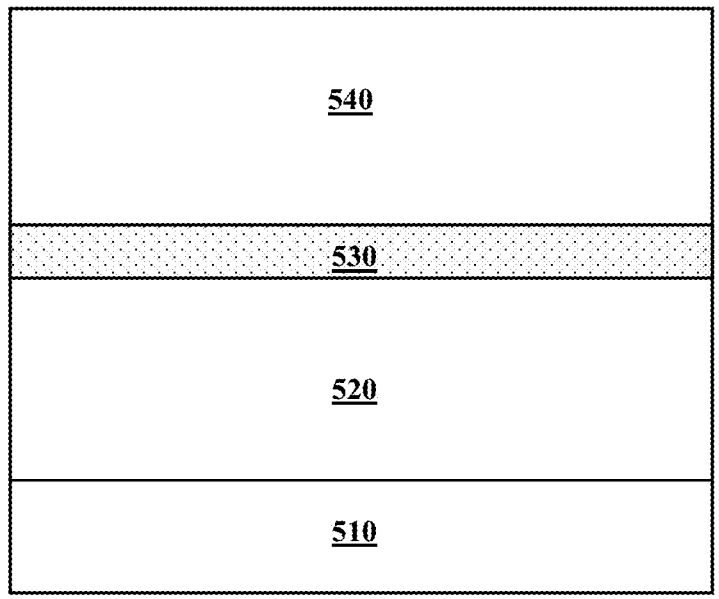
FIGS. 5A-5C are cross sectional views illustrating a process of forming an IGBT device according to an aspect of the present disclosure.
Figure 5B:
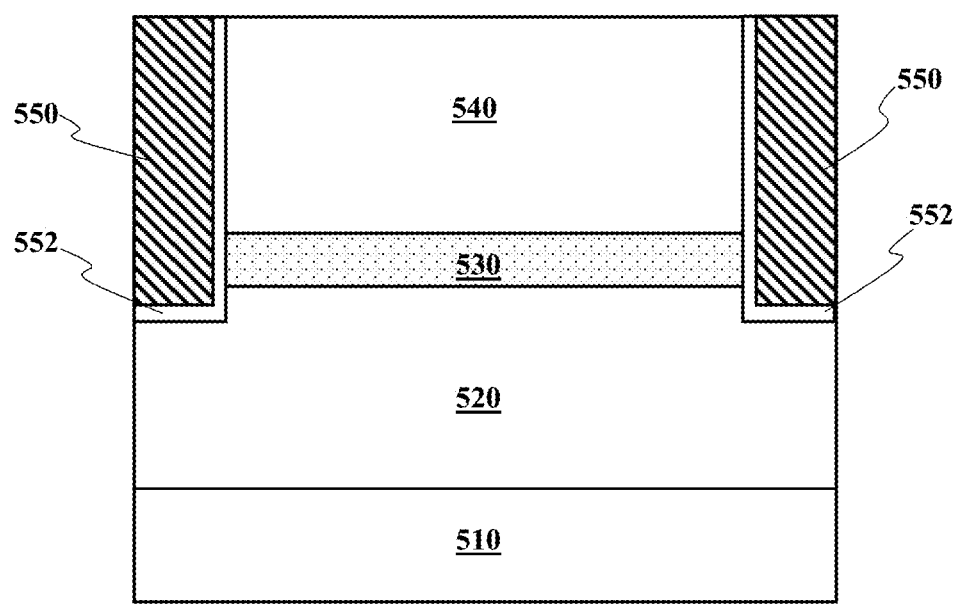
Figure 5C:
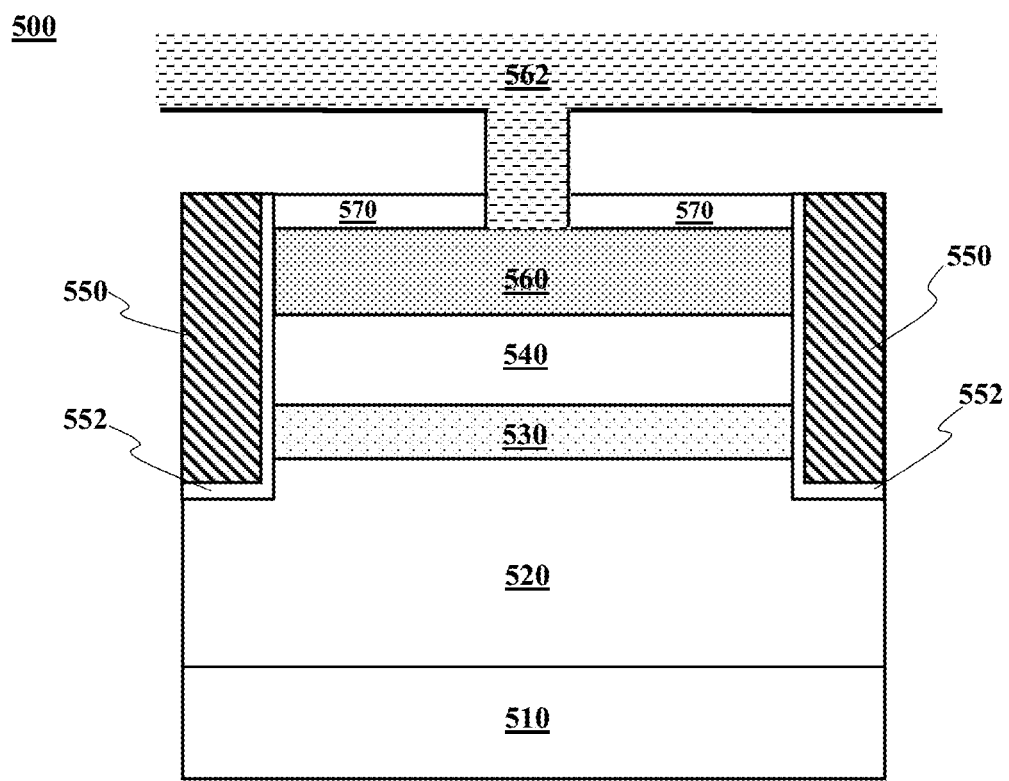

FIGS. 5A-5C show an example of a possible method of forming the IGBT device of the present disclosure. FIG. 5A shows a starting semiconductor substrate including a bottom semiconductor layer 510 of a first conductivity type (e.g., a P-type substrate) and a semiconductor layer 520 of a second conductivity type that is opposite the first conductivity type (e.g., an N-epitaxial layer) located thereon. A semiconductor layer 530 of a first conductivity type and a semiconductor layer 540 of a second conductivity type may be formed by epitaxial growth or ion implant. By way of example using ion implant, and not by way of limitation, the P-type dopants of the layer 530 of a first conductivity type may be boron or BF2, and the N-type dopants of the layer 540 of a second conductivity type may be phosphorus, arsenic, or antimony.

In FIG. 5B, trenches are etched through the semiconductor layers 540 and 530 and slightly into the semiconductor layer 520. The trenches may then be lined with a dielectric (e.g., oxide 552). The gate oxide 552 may be formed in an oxide deposition process. Thereafter, a gate electrode material (e.g., polysilicon) is then filled into the trenches to form gate electrode. Alternatively, the P layer 530 and N layer 540 may be formed by ion implant in the process after depositing the gate electrode material.

A P body region 560 and the source region 570 are formed (e.g., by implantation) on top of the N layer 540 shown in FIG. 5C. An emitter electrode 562 is formed on the top surface contacting the source region 570 and P body region 560. A gate electrode (not shown) is formed by electrical connecting the trench gate 550. A collector electrode (not shown) may be formed on the back surface contacting the bottom semiconductor layer 510.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forming an IGBT device, comprising:
   forming one or more trenches for trench gates in a substrate including a bottom semiconductor layer of a first conductivity type and an upper semiconductor layer of a second conductivity type located above the bottom semiconductor layer, wherein each of the one or more trenches is provided with a gate insulator on each side of the trench and filled with polysilicon and wherein the trench extends vertically into the upper semiconductor layer;
   forming a floating body region of the first conductivity type between two neighboring trenches and over the substrate, wherein a bottom of the floating body region is close in depth to but above a bottom of the polysilicon in the trench;
   forming a top region of the second conductivity type over the floating body region, wherein the top region of the second conductivity type is heavily doped; and
   forming a body region of the first conductivity type over the top region, wherein the body region extends from one of the two neighboring trenches to the other of the two neighboring trenches, wherein a doping concentration of the floating body region of the first conductivity type is lower than that of the body region of the first conductivity type; and
   forming a heavily doped source region of the second conductivity type disposed over the body region of the first conductivity type and proximate a sidewall of each of the one or more trenches.

2. The method of claim 1, wherein the first conductivity type is P and the second conductivity type is N.

3. The method of claim 1, wherein the first conductivity type is N and the second conductivity type is P.

4. The method of claim 1, wherein a bottom of the trench gate reaches into the upper semiconductor layer.

5. The method of claim 1, wherein the one or more trench gates extend vertically to a depth approximately in a range from about 5 to about 10 microns with a pitch of about 3 to 15 microns.

6. The method of claim 1, wherein a ratio of pitch to trench depth is between about 0.5 to about 3.

7. The method of claim 1, wherein the doping concentration of the floating body region of the first conductivity type is about 1e16 cm$^{-3}$.

8. The method of claim 1, wherein the top region of the second conductivity type has a doping concentration ranging from about 5e16 cm$^{-3}$ to about 5e17 cm$^{-3}$.

9. The method of claim 1, wherein the doping concentration of the body region of the first conductivity type ranges from about 1e17 cm$^{-3}$ to about 1e18 cm$^{-3}$.

10. The method of claim 1 further comprising forming a planar gate disposed over the semiconductor substrate.

11. The method of claim 10, wherein at least one trench gate extends on its top side to connect to the planar gate.

12. The IGBT device of claim 1 further comprising forming a lightly doped source region of the second conductivity type disposed between the heavily doped source region and a planar gate.

* * * * *